(12) United States Patent
Iwamoto

(10) Patent No.: US 10,804,196 B2
(45) Date of Patent: Oct. 13, 2020

(54) ELECTRONIC COMPONENT DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 35 days.

(21) Appl. No.: 16/296,281

(22) Filed: Mar. 8, 2019

(65) Prior Publication Data

US 2019/0206790 A1 Jul. 4, 2019

Related U.S. Application Data

(63) Continuation of application No. PCT/JP2017/030569, filed on Aug. 25, 2017.

(30) Foreign Application Priority Data

Oct. 28, 2016 (JP) ................................. 2016-211907

(51) Int. Cl.
*H01L 23/26* (2006.01)
*H01L 23/522* (2006.01)
(Continued)

(52) U.S. Cl.
CPC .......... *H01L 23/5226* (2013.01); *H01L 23/12* (2013.01); *H01L 23/14* (2013.01);
(Continued)

(58) Field of Classification Search
CPC . H01L 2224/73265; H01L 2224/48227; H01L 2924/181; H01L 2924/0665;
(Continued)

(56) References Cited

U.S. PATENT DOCUMENTS 7,132,756 B2 * 11/2006 Sugaya ............. H01L 23/49822
257/787
2004/0251540 A1 * 12/2004 Eguchi ..................... H01L 23/42
257/713
(Continued)

FOREIGN PATENT DOCUMENTS

JP 2007-305741 A 11/2007
JP 2012-060100 A 3/2012
(Continued)

OTHER PUBLICATIONS

Official Communication issued in International Patent Application No. PCT/JP20171030569, dated Oct. 31, 2017.

*Primary Examiner* — S. V. Clark
(74) *Attorney, Agent, or Firm* — Keating & Bennett, LLP

(57) ABSTRACT

An electronic component device includes an electronic component embedded in a resin structure and including a portion exposed on a first main surface of the resin structure, first wiring lines extending from the first main surface of the resin structure to the electronic component and electrically connected to the electronic component, second wiring lines on a side of a second main surface of the resin structure and electrically connected to respective connection electrodes that are electrically connected to the first wiring lines, and low-elastic modulus layers at a height position between the first wiring lines and the exposed portion of the electronic component in respective regions in which the first wiring lines straddle boundaries between the resin structure and the electronic component, having elastic moduli lower than those of the first wiring lines, and made of a conductive material.

20 Claims, 5 Drawing Sheets

(51) Int. Cl.

| | | |
|---|---|---|
| *H01L 23/31* | (2006.01) | |
| *H01L 23/498* | (2006.01) | |
| *H01L 23/538* | (2006.01) | |
| *H05K 3/46* | (2006.01) | |
| *H05K 3/34* | (2006.01) | |
| *H01L 23/14* | (2006.01) | |
| *H01L 25/07* | (2006.01) | |
| *H01L 23/12* | (2006.01) | |
| *H01L 25/18* | (2006.01) | |
| *H01L 25/065* | (2006.01) | |

(52) U.S. Cl.
CPC ........ *H01L 23/145* (2013.01); *H01L 23/3114* (2013.01); *H01L 23/3121* (2013.01); *H01L 23/49827* (2013.01); *H01L 23/49883* (2013.01); *H01L 23/5389* (2013.01); *H01L 25/065* (2013.01); *H01L 25/07* (2013.01); *H01L 25/18* (2013.01); *H05K 3/34* (2013.01); *H05K 3/46* (2013.01)

(58) Field of Classification Search
CPC . H01L 2224/85; H01L 2224/83; H01L 24/48; H01L 21/56; H01L 2224/83191
USPC .................................................. 257/787, 790
See application file for complete search history.

(56) References Cited

U.S. PATENT DOCUMENTS

| | | | |
|---|---|---|---|
| 2010/0052163 A1* | 3/2010 | Ouchi | ................... H01L 21/563 |
| | | | 257/737 |
| 2011/0193217 A1 | 8/2011 | Meyer-Berg | |
| 2012/0218721 A1 | 8/2012 | Nishimura | |
| 2012/0319254 A1* | 12/2012 | Kikuchi | ................... H01L 24/23 |
| | | | 257/659 |
| 2013/0034934 A1 | 2/2013 | Meguro et al. | |
| 2015/0207050 A1 | 7/2015 | Tsukada et al. | |
| 2017/0213940 A1* | 7/2017 | Sakai | ................... H01L 33/483 |
| 2019/0081610 A1* | 3/2019 | Iwamoto | ............... H03H 9/1085 |

FOREIGN PATENT DOCUMENTS

| | | |
|---|---|---|
| WO | 2011/062252 A1 | 5/2011 |
| WO | 2013/168223 A1 | 11/2013 |

\* cited by examiner

ELECTRONIC COMPONENT DEVICE

CROSS REFERENCE TO RELATED APPLICATIONS

This application claims the benefit of priority to Japanese Patent Application No. 2016-211907 filed on Oct. 28, 2016 and is a Continuation Application of PCT Application No. PCT/JP2017/030569 filed on Aug. 25, 2017. The entire contents of each of these applications are hereby incorporated herein by reference.

BACKGROUND OF THE INVENTION

1. Field of the Invention

The present invention relates to an electronic component device including an electronic component embedded in a resin structure.

2. Description of the Related Art

Various electronic component devices including electronic components embedded in resin structures have been recently proposed. For example, in the electronic component device disclosed in Japanese Unexamined Patent Application Publication No. 2012-60100, a semiconductor device is embedded in a plate-shaped resin structure as an electronic component. The semiconductor device is embedded in the resin structure such that the upper surface of the semiconductor device is exposed on the upper surface of the resin structure. A wiring line is provided to extend from the upper surface of the semiconductor device to the upper surface of the resin structure. The wiring line includes a lower wiring line and an upper wiring line. In Japanese Unexamined Patent Application Publication No. 2012-60100, the elastic modulus of the lower wiring line is set to be higher than that of the upper wiring line.

When heat is applied to an electronic component device including an electronic component, such as a semiconductor device embedded in a resin structure, a break may occur in a wiring line. The reason for this is that, at the time of application of heat, a high stress is generated because of the difference in coefficients of linear expansion between the resin structure and the electronic component or the difference in coefficients of linear expansion between an electrode, such as a through electrode provided at the resin structure, and the resin structure.

A configuration is known which reduces or prevents a stress at the time of application of heat by placing a resin layer below a wiring line.

However, the placement of such a resin layer increases the thickness of an electronic component device. In order to reduce the profile of the electronic component device by the thickness of the resin layer, the thickness of the wiring line needs to be reduced. In this case, however, an ohmic loss becomes large.

SUMMARY OF THE INVENTION

Preferred embodiments of the present invention provide electronic component devices in each of which a break is less likely to occur in a wiring line and an increase in an ohmic loss is able to be reduced or prevented.

An electronic component device according to a preferred embodiment of the present invention includes a resin structure including a first main surface and a second main surface that face each other, an electronic component that is embedded in the resin structure and includes a portion exposed on the first main surface of the resin structure, a first wiring line that extends from the first main surface of the resin structure to the electronic component and is electrically connected to the electronic component, a connection electrode that connects the first main surface and the second main surface of the resin structure and is electrically connected to the first wiring line, a second wiring line that is provided on a side of the second main surface of the resin structure and is electrically connected to the connection electrode, and a low-elastic modulus layer that is provided at a height position between the first wiring line and the exposed portion of the electronic component in a region in which the first wiring line straddles at least a boundary between the resin structure and the electronic component, has an elastic modulus lower than an elastic modulus of the first wiring line, and is made of a conductive material.

An electronic component device according to a preferred embodiment of the present invention includes a resin structure including a first main surface and a second main surface that face each other, an electronic component that is embedded in the resin structure and includes a portion exposed on the first main surface of the resin structure, a first wiring line that extends from the first main surface of the resin structure to the electronic component and is electrically connected to the electronic component, a connection electrode that connects the first main surface and the second main surface of the resin structure, passes through the resin structure, and is electrically connected to the first wiring line, a second wiring line that is provided on a side of the second main surface of the resin structure and is electrically connected to the connection electrode, a third wiring line that is connected to the connection electrode and extends from the connection electrode to the first main surface of the resin structure, and a low-elastic modulus layer that is provided at a height position between the third wiring line and the exposed portion of the electronic component in a region in which the third wiring line straddles at least a boundary between the connection electrode and the resin structure, has an elastic modulus lower than an elastic modulus of the third wiring line, and is made of a conductive material.

In an electronic component device according to a preferred embodiment of the present invention, the low-elastic modulus layer is in contact with the first main surface of the resin structure.

In an electronic component device according to a preferred embodiment of the present invention, in plan view of the first wiring line, the low-elastic modulus layer overlaps an entire or substantially an entire undersurface of the first wiring line. In this case, the occurrence of a break in the first wiring line is able to be more effectively reduced or prevented.

In an electronic component device according to a preferred embodiment of the present invention, in plan view of the third wiring line, the low-elastic modulus layer overlaps an entire or substantially an entire undersurface of the third wiring line. In this case, the occurrence of a break in the third wiring line is able to be more effectively reduced or prevented.

In an electronic component device according to a preferred embodiment of the present invention, the electronic component device further includes a second low-elastic modulus layer that is provided between the second wiring line and the resin structure and has electrical conductivity. The second low-elastic modulus layer is provided at a height position between the second main surface of the resin structure and the second wiring line in a region in which the second wiring line straddles at least a boundary between the connection electrode and the resin structure. In this case, the occurrence of a break in the second wiring line is also able to be reduced or prevented.

In an electronic component device according to a preferred embodiment of the present invention, the electronic component device further includes an insulating layer surrounding the first wiring line and the second wiring line.

In an electronic component device according to a preferred embodiment of the present invention, the low-elastic modulus layer is made of a metal or a composite material made of a metal and a resin. In this case, an ohmic loss is able to be further reduced.

In an electronic component device according to a preferred embodiment of the present invention, the electronic component device further includes an electronic component or a substrate joined to the first main surface or the second main surface of the resin structure.

In an electronic component device according to a preferred embodiment of the present invention, the electronic component device is an interposer incorporating a component.

With electronic component devices according to preferred embodiments of the present invention, a break is less likely to occur in a wiring line and the increase in an ohmic loss is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below through the description of specific preferred embodiments of the present invention with reference to the accompanying drawings.

It is to be noted that the preferred embodiments described in this specification are merely illustrative and the configurations described below may be partially replaced or combined between the different preferred embodiments.

Figure 1:
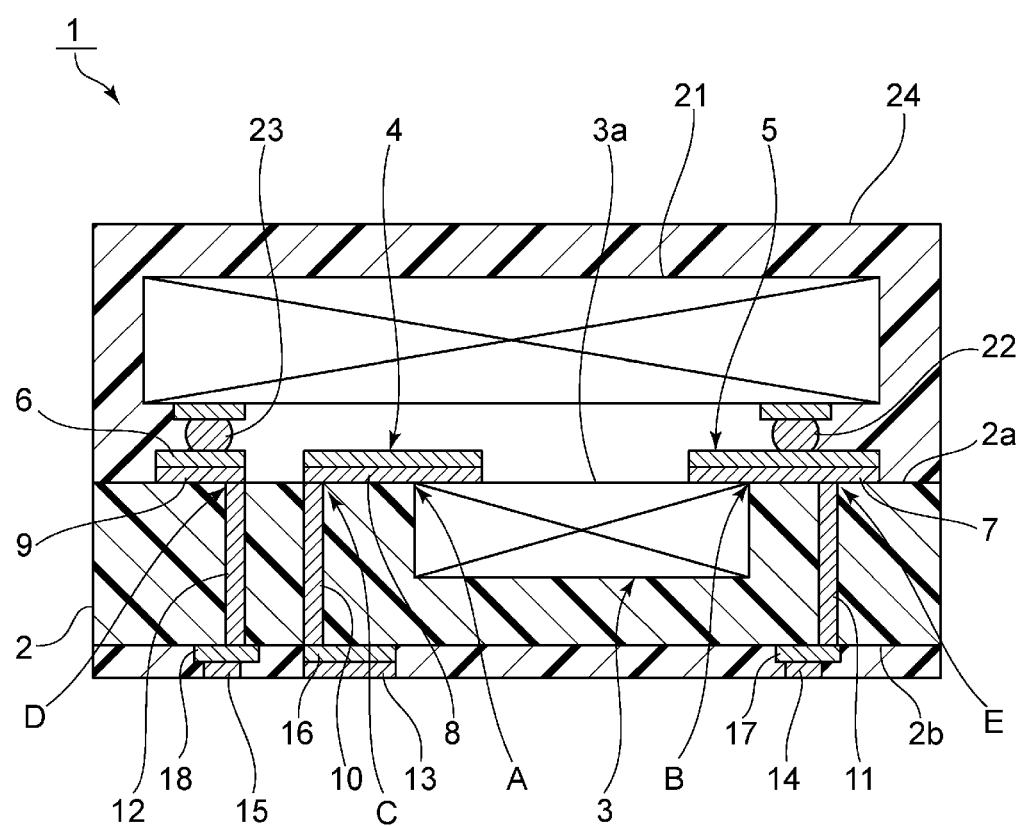
FIG. 1 is an elevational cross-sectional view of an electronic component device according to a first preferred embodiment of the present invention.
Figure 2:
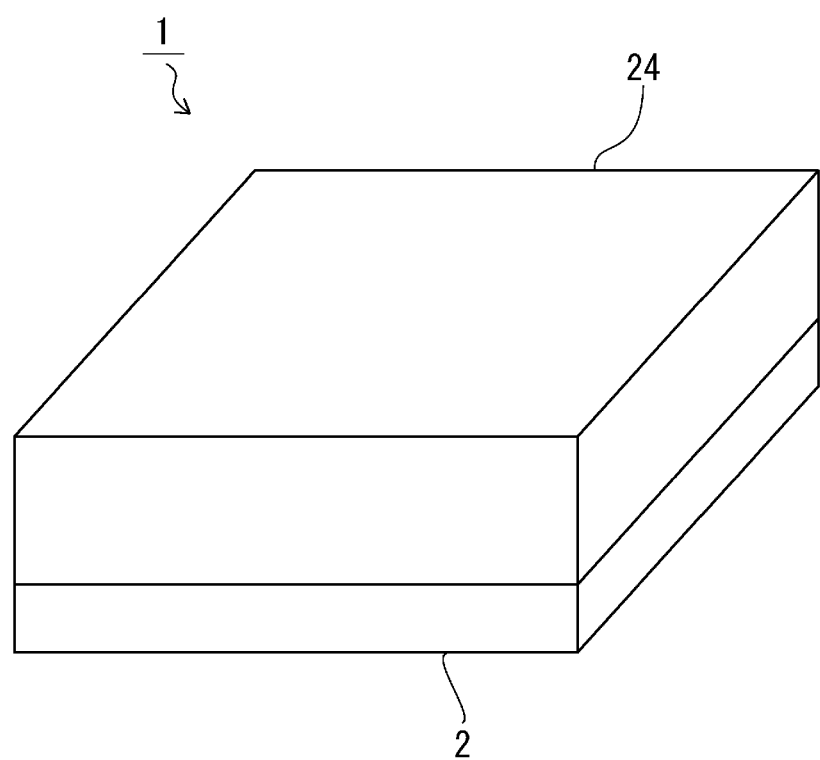
FIG. 2 is a perspective view of an electronic component device according to the first preferred embodiment of the present invention.

FIG. 1 is an elevational cross-sectional view of an electronic component device according to a first preferred embodiment of the present invention. FIG. 2 is a perspective view of an electronic component device according to the first preferred embodiment of the present invention.

An electronic component device 1 includes a resin structure 2. The resin structure 2 has a plate shape. The resin structure 2 includes a first main surface 2a and a second main surface 2b that are opposed to each other. The resin structure 2 is preferably made of a synthetic resin. Examples of the synthetic resin include an epoxy resin and an acrylic resin.

A material obtained by adding an inorganic filler, such as silica or alumina, for example, to a synthetic resin, such as an epoxy resin, for example, is preferably used. The addition of such an inorganic filler enables the resin structure 2 to seal an electronic component 3 to be described below with more certainty. In addition, the rigidity of the resin structure 2 is able to be increased and the degree of shrinkage of the resin structure 2 at the time of curing is able to be reduced. As a result, accuracy is able to be increased.

More preferably, a synthetic resin, such as an epoxy resin, contains, for example, about 50% by weight or more of an inorganic filler. In this case, the rigidity of the resin structure 2 is able to be further increased.

The electronic component 3 is embedded in the resin structure 2. An upper surface 3a of the electronic component 3 is exposed on the first main surface 2a of the resin structure 2. The upper surface 3a of the electronic component 3 is a portion exposed on the first main surface 2a of the resin structure 2. Although not particularly limited, the upper surface 3a of the electronic component 3 is flush with the first main surface 2a in the present preferred embodiment. On the first main surface 2a, first wiring lines 4 and 5 are provided. The first wiring lines 4 and 5 are electrically connected to the electronic component 3. The first wiring lines 4 and 5 extend from the upper surface 3a of the electronic component 3 to the first main surface 2a of the resin structure 2.

On the second main surface 2b of the resin structure 2, second wiring lines 13, 14, and 15 are provided. On the first main surface 2a, a third wiring line 6 is provided.

The first wiring lines 4 and 5, the second wiring lines 13 to 15, and the third wiring line 6 are preferably made of a metal or an alloy. Although the metal or alloy is not particularly limited, Cu, for example, is preferably used in the present preferred embodiment.

Low-elastic modulus layers 8, 7, and 9 are laminated on the undersurfaces of the first wiring lines 4 and 5 and the third wiring line 6, respectively. The low-elastic modulus layers 8, 7, and 9 are made of conductive materials whose moduli are lower than those of the first wiring lines 4 and 5 and the third wiring line 6. Such conductive materials are not particularly limited as long as the above elastic modulus relationship is satisfied. In the present preferred embodiment, the low-elastic modulus layers 7 to 9 are preferably made of a composite material made of Cu and a resin, for example.

Through electrodes 10 to 12 are provided to be electrically connected to the first wiring lines 4 and 5 and the third wiring line 6, respectively as connection electrodes. The through electrodes 10 to 12 pass through the resin structure 2 and extend from the first main surface 2a to the second main surface 2b. One ends of the through electrodes 10 to 12 are joined to the low-elastic modulus layers 8, 7, and 9 to be electrically connected to the first wiring lines 4 and 5 and the third wiring line 6, respectively.

The through electrodes 10 to 12 are made of an appropriate metal or alloy. In the present preferred embodiment, the through electrodes 10 to 12 are preferably made of Cu, for example.

In the present preferred embodiment, on the first main surface 2a of the resin structure 2, in a region in which the first wiring line 4 straddles the boundary between the electronic component 3 and the resin structure 2, that is, a portion indicated by an arrow A, the low-elastic modulus layer 8 is directly laminated on the undersurface of the first wiring line 4. The low-elastic modulus layer 7 is similarly directly laminated on the undersurface of the first wiring line 5 in a region in which the first wiring line 5 straddles the boundary between the electronic component 3 and the resin structure 2, that is, a region indicated by an arrow B. The low-elastic modulus layer 9 is directly laminated on the undersurface of the third wiring line 6 in a region in which the third wiring line 6 straddles the boundary between the resin structure 2 and the through electrode 12.

The second wiring lines 13 to 15 are preferably made of the same material as the first wiring lines 4 and 5 and the third wiring line 6. On the surfaces of the second wiring lines 13 to 15 on the side of the second main surface 2b, second low-elastic modulus layers 16 to 18 are provided, respectively. The second low-elastic modulus layers 16 to 18 are preferably made of the same material as the low-elastic modulus layers 8, 7, and 9. The elastic moduli of the second low-elastic modulus layers 16 to 18 are lower than those of the second wiring lines 13 to 15. The second low-elastic modulus layers 16 to 18 are joined to the through electrodes 10 to 12, respectively. As a result, the through electrodes 10 to 12 are electrically connected to the second wiring lines 13 to 15, respectively.

On the resin structure 2, an electronic component 21 is disposed using bumps 22 and 23. That is, the bumps 22 and 23 are joined to the first wiring line 5 and the third wiring line 6, respectively, so that the electronic component 21 is disposed on the resin structure 2. As the electronic component 21, an appropriate electronic component, such as an elastic wave filter, a piezoelectric resonator, or a multi-layer capacitor, for example, may preferably be provided. Alternatively, as the electronic component 21, a module component may be provided. The details of the electronic component 3 will be described below.

One of the features of the electronic component device 1 is that, in a region in which the first wiring line 4 straddles at least the boundary between the electronic component 3 and the resin structure 2, that is, the portion indicated by the arrow A, the low-elastic modulus layer 8 is laminated on the first wiring line 4. Another one of the features of the electronic component device 1 is that, in a region in which the first wiring line 5 straddles at least the boundary between the electronic component 3 and the resin structure 2, that is, the region indicated by the arrow B, the low-elastic modulus layer 7 is laminated on the first wiring line 5. Still another one of the features of the electronic component device 1 is that, in a region in which the third wiring line 6 straddles the boundary between the resin structure 2 and the through electrode 12 that is a connection electrode, the low-elastic modulus layer 9 is laminated on the third wiring line 6. For example, in the case of the first wiring line 4, a break has easily occurred at the position indicated by the arrow A at the time of heating. The reason for this is that, when the resin structure 2 is cured by heat or heat is applied after completion, a high stress is generated at the position indicated by the arrow A because of the difference in coefficient of linear expansion between the electronic component 3 and the resin structure 2.

In contrast, in the present preferred embodiment, the first wiring line 4 is laminated on the low-elastic modulus layer 8 having electrical conductivity. Since the elastic modulus of the low-elastic modulus layer 8 is relatively low, the occurrence of a break is able to be effectively reduced or prevented. In addition, since the low-elastic modulus layer 8 has electrical conductivity, an ohmic loss in a multilayer body including the first wiring line 4 and the low-elastic modulus layer 8 is small. Accordingly, the increase in an ohmic loss is able to be reduced or prevented and the occurrence of a break is able to be effectively reduced or prevented. The same is true for the first wiring line 5. The presence of the low-elastic modulus layer 7 reduces or prevents the occurrence of a break at a position indicated by the arrow B.

On the other hand, at the position at the boundary between the resin structure 2 and the through electrode 10 which is indicated by an arrow C, a high stress is similarly generated at the time of application of heat. Since the low-elastic modulus layer 8 is laminated on the first wiring line 4 at the position indicated by the arrow C, a break is less likely to occur in the first wiring line 4. Also at the positions indicated by arrows D and E, the presence of the low-elastic modulus layers 7 and 9 reduces or prevents the occurrence of breaks in the first wiring line 5 and the third wiring line 6, respectively.

In the present preferred embodiment, since the second low-elastic modulus layers 16 to 18 are provided on the side of the second main surface 2b, breaks are less likely to occur in the second wiring lines 13 to 15.

Instead of the through electrodes 10 to 12, a connection electrode provided on the side surface of the resin structure 2 may be used. That is, a connection electrode may be provided to connect the first main surface 2a and the second main surface 2b in preferred embodiments of the present invention. An electrode, such as the through electrodes 10 to 12 passing through the resin structure 2, does not necessarily have to be provided, and a connection electrode provided on the upper side surface may be used. In a case in which a wiring line is located at the boundary between the connection electrode provided on the side surface and the resin structure, the occurrence of a break in the wiring line is similarly able to be effectively reduced or prevented when a low-elastic modulus layer is laminated on the wiring line. In addition, since the low-elastic modulus layer has electrical conductivity, the increase in an ohmic loss is also able to be reduced or prevented.

Figure 3:
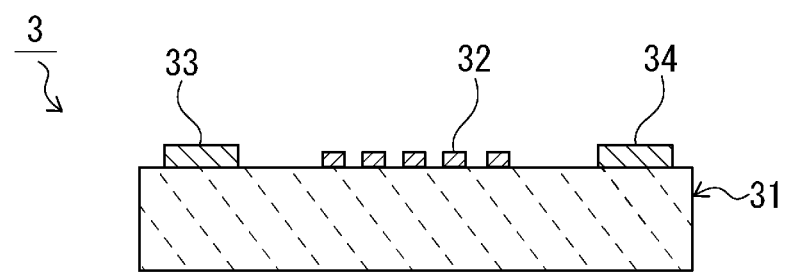
FIG. 3 is an elevational cross-sectional view of an electronic component embedded in an electronic component device according to the first preferred embodiment of the present invention.

Although the electronic component 3 is not particularly limited, an elastic wave device illustrated in FIG. 3 is embedded as the electronic component 3 in the present preferred embodiment. As illustrated in FIG. 3, the electronic component 3 includes a piezoelectric substrate 31. The piezoelectric substrate 31 may preferably be made of piezoelectric monocrystal, such as $LiTaO_3$ or $LiNbO_3$, or piezoelectric ceramics, for example.

On the piezoelectric substrate 31, functional electrodes including an IDT electrode 32 are provided. Terminal electrodes 33 and 34 are connected to the IDT electrode 32. In the present preferred embodiment, a plurality of IDT electrodes are provided to define an elastic wave filter device. The terminal electrodes 33 and 34 are electrically connected to the first wiring lines 4 and 5 illustrated in FIG. 1, respectively. That is, the undersurface of a multilayer body including the first wiring line and the low-elastic modulus layer 8 is in contact with the terminal electrode 33. The undersurface of a multilayer body including the first wiring line 5 and the low-elastic modulus layer 7 is similarly in contact with the terminal electrode 34. In this case, the boundary portion between the piezoelectric substrate 31 in the electronic component 3 and the resin structure 2 is the portion indicated by the arrows A and B illustrated in FIG. 1. The difference in coefficients of linear expansion between piezoelectric monocrystal and a resin is very large. Accordingly, at the time of the application of heat, a high stress is applied to the positions indicated by the arrows A and B. However, since the low-elastic modulus layers 8 and 7 are provided as described above, the occurrence of breaks of the first wiring lines 4 and 5 at the positions indicated by the arrows A and B is able to be effectively reduced or prevented.

In the present preferred embodiment, the low-elastic modulus layers 7 to 9 are in contact with the first main surface 2a of the resin structure 2. However, another material layer may be disposed between the first main surface 2a of the resin structure 2 and the low-elastic modulus layers 7 to 9. Between each of the low-elastic modulus layers 8, 7, and 9 and the corresponding one of the first wiring lines 4 and 5 and the third wiring line 6, another material layer may be laminated. In this case, it is preferable that the material layer is made of a conductive material. As a result, an ohmic loss is able to be reduced.

As described above, the low-elastic modulus layers 8, 7, and 9 may be located at a height position between the first wiring lines 4 and 5 and the third wiring line 6 and the first main surface 2a on which the electronic component 3 is exposed in a height direction when viewed in cross section illustrated in FIG. 1. Accordingly, the low-elastic modulus layer 8, 7, and 9 may be directly or indirectly laminated on the first wiring lines 4 and 5 and the third wiring line 6, respectively.

The same is true for the second low-elastic modulus layers 16 to 18 on the side of the second main surface 2b. That is, the second low-elastic modulus layers 16 to 18 may be provided at a height position between the second main surface 2b of the resin structure 2 and the second wiring lines 13 to 15.

Figure 4:
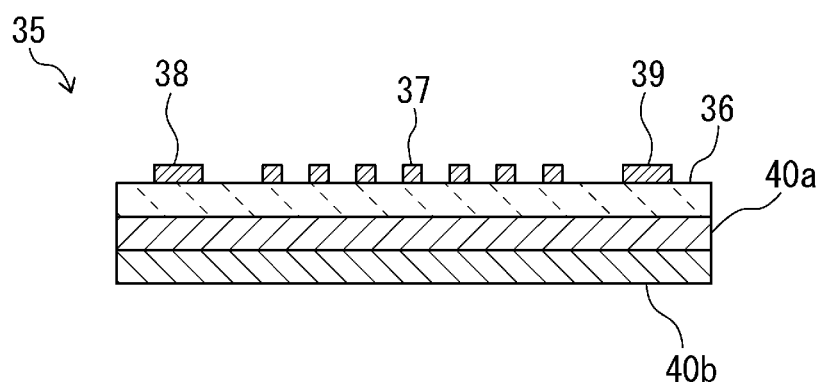
FIG. 4 is an elevational cross-sectional view of another example of an embedded electronic component according to a preferred embodiment of the present invention.

Although the electronic component 3 illustrated in FIG. 3 is embedded in the above-described preferred embodiment, an electronic component 35 including a piezoelectric thin film 36 illustrated in FIG. 4 may be embedded. In the electronic component 35, functional electrodes including an IDT electrode 37 and terminal electrodes 38 and 39 are provided on the piezoelectric thin film 36. On the surface of the piezoelectric thin film 36 which is opposite to the surface on which the functional electrodes are provided, a low acoustic velocity film 40a and a high acoustic velocity film 40b are laminated. The low acoustic velocity film 40a is made of a material through which a bulk wave propagates at a lower acoustic velocity than an elastic wave propagating through the piezoelectric thin film 36. The high acoustic velocity film 40b is made of a material through which a bulk wave propagates at a higher acoustic velocity than an elastic wave propagating through the piezoelectric thin film 36.

The structure of the electronic component 3 embedded in the resin structure 2 is not limited to the above-described structures. That is, an appropriate electronic component including an electronic component body preferably made of ceramics or monocrystal, for example, may be used as the electronic component 3.

In the electronic component device 1, a sealing resin 24 and the electronic component 21 that is a second electronic component are not necessarily provided. That is, the electronic component device 1 according to the present preferred embodiment may be a component in which the electronic component 3 is embedded in the resin structure 2 which defines an interposer.

Another electronic component or a substrate may be joined to the second main surface 2b of the resin structure 2 in the electronic component device 1. That is, the electronic component device 1 may be mounted on a mounting board. Alternatively, the electronic component device 1 may be mounted on a third electronic component.

Although a method of manufacturing the first wiring lines 4 and 5, the third wiring line 6, and the low-elastic modulus layers 8, 7, and 9 is not particularly limited, a non-limiting example of a manufacturing method will be described.

In the present preferred embodiment, Cu-based conductive paste containing resin binder is applied to portions at which the low-elastic modulus layers 7 to 9 are to be provided. Preferred examples of such a resin material include a urethane resin, an epoxy resin, an acrylic resin, and a liquid crystal polymer. An elastic modulus obtained after the curing of the Cu-based conductive paste containing resin binder is lower than the elastic modulus of Cu that is a metal. The elastic modulus obtained after curing is preferably less than or equal to about 30 GPa, for example, to reduce or prevent the occurrence of a break at the time of application of a thermal stress.

The conductive paste is heated to be cured for the formation of the low-elastic modulus layers 7 to 9. Subsequently, on the low-elastic modulus layers 8, 7, and 9, resist patterns including openings in portions at which the first wiring lines 4 and 5 and the third wiring line 6 are to be provided are formed, respectively. Subsequently, a Cu plating film is formed by electrolytic plating. After that, the resist is peeled off. As a result, the first wiring lines 4 and 5 and the third wiring line 6 made of a Cu plating film are formed. It is preferable that the electrical resistances of the first wiring lines 4 and 5 and the third wiring line 6 are low. It is therefore preferable that the degree of purity of Cu is sufficiently high. In this case, an elastic modulus is preferably greater than or equal to about 120 GPa, for example.

The formation of a portion including the first wiring lines 4 and 5 and the third wiring line 6 and the low-elastic modulus layers 8, 7, and 9 on the resin structure 2 in the electronic component device 1 may be performed on a collective board of the resin structure 2. After that, they may be singulated.

Figure 5:
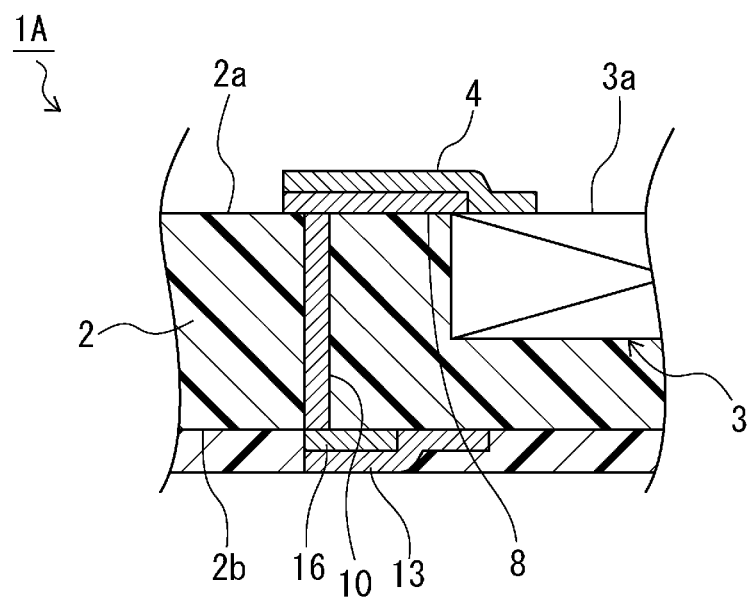
FIG. 5 is a partially cut-out elevational cross-sectional view of a main portion of an electronic component device according to a second preferred embodiment of the present invention.

FIG. 5 is a partially cut-out elevational cross-sectional view of a main portion of an electronic component device according to a second preferred embodiment of the present invention. FIG. 5 illustrates a portion corresponding to a portion at which the first wiring line 4 and the low-elastic modulus layer 8 are provided in the first preferred embodiment.

In an electronic component device 1A according to the second preferred embodiment, the electronic component 3 is embedded in the resin structure 2. The first wiring line 4 extends from the upper surface 3a of the electronic component 3 to the first main surface 2a of the resin structure 2. The low-elastic modulus layer 8 is not laminated on the entire undersurface of the first wiring line 4. However, the low-elastic modulus layer 8 is provided in a region straddling the boundary between the electronic component 3 and the resin structure 2 and a region straddling the boundary between the through electrode 10 and the resin structure 2.

Accordingly, as in the first preferred embodiment, the occurrence of a break in the first wiring line 4 is able to be effectively reduced or prevented. In addition, an ohmic loss is less likely to increase. Also on the side of the second main surface 2b, the second low-elastic modulus layer 16 is provided between the second wiring line 13 and the second main surface 2b. As a result, the occurrence of a break in the second wiring line 13 is reduced or prevented.

Figure 6:
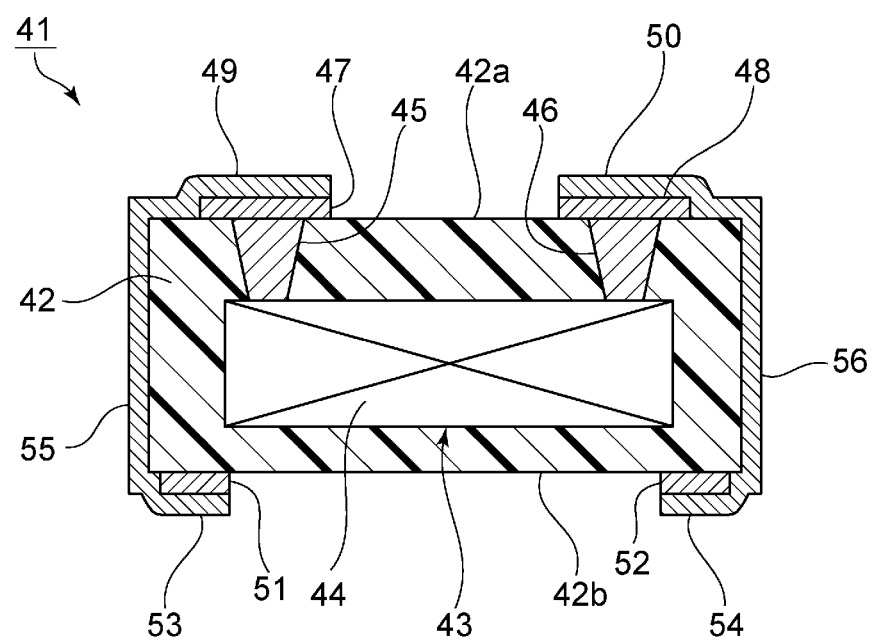
FIG. 6 is an elevational cross-sectional view of an electronic component device according to a third preferred embodiment of the present invention.

FIG. 6 is an elevational cross-sectional view of an electronic component device according to a third preferred embodiment of the present invention. In an electronic component device 41, an electronic component 43 is embedded in a resin structure 42. The electronic component 43 includes an electronic component body 44 and pillar electrodes 45 and 46 protruding upward from the electronic component body 44. The electronic component body 44 includes a functional electrode (not illustrated).

On a first main surface 42a of the resin structure 42, the pillar electrodes 45 and 46 are exposed. Also in the present preferred embodiment, a portion of the electronic component 43 is exposed on the first main surface 42a. On the first main surface 42a, low-elastic modulus layers 47 and 48 are provided. On the low-elastic modulus layers 47 and 48, wiring lines 49 and 50 are provided, respectively. Also on a second main surface 42b, low-elastic modulus layers 51 and 52 and wiring lines 53 and 54 are provided. A connection electrode 55 provided on the side surface of the resin structure 42 is integrally connected to the wiring lines 49 and 53. A connection electrode 56 is provided on the side surface of the resin structure 42. The connection electrode 56 is also integrally connected to the wiring lines 50 and 54.

Also in the present preferred embodiment, a high stress is applied to the interface between the resin structure 42 and each of the pillar electrodes 45 and 46 at the time of application of heat. The low-elastic modulus layer 47 is provided to straddle the boundary between the pillar electrode 45 and the resin structure 42 and the low-elastic modulus layer 48 is provided to straddle the boundary between the pillar electrode 46 and the resin structure 42, so that the occurrence of a break caused by the above-described stress is able to be effectively reduced or prevented. Since each of the low-elastic modulus layers 47, 48, 51, and 52 is made of a conductive material, an ohmic loss does not increase.

An electronic component device embedded in a resin structure, such as the electronic component device 41, may include a pillar electrode.

Figure 7:
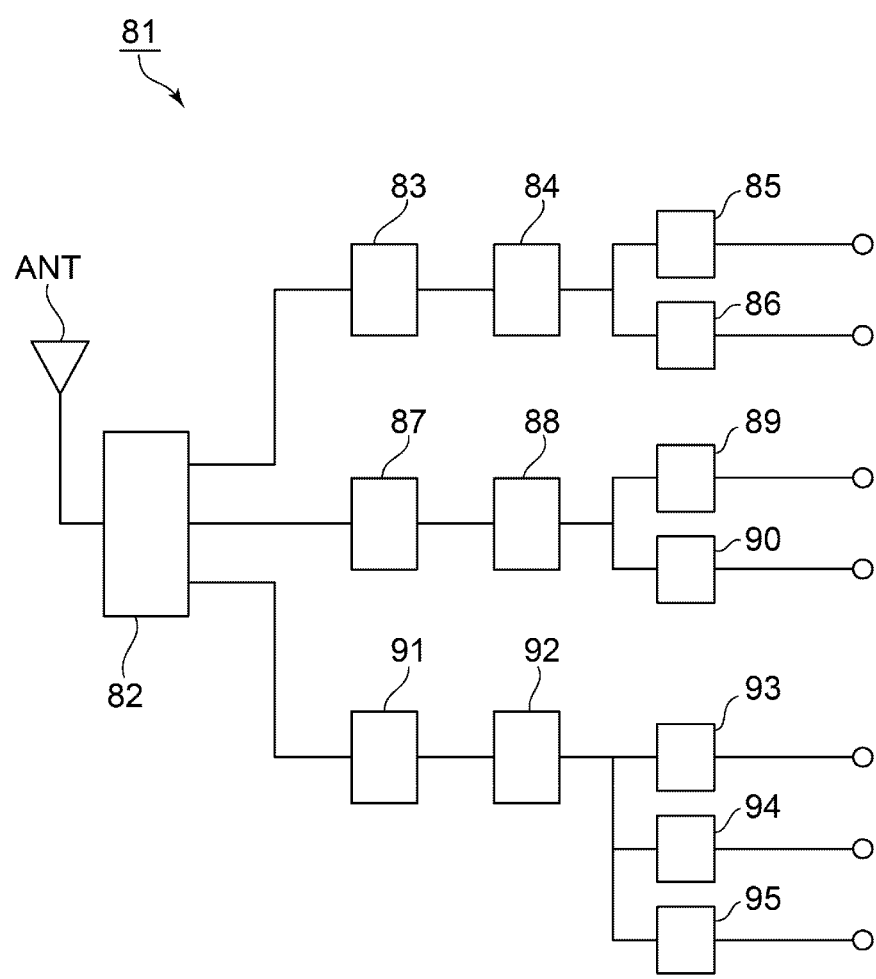
FIG. 7 is a circuit diagram illustrating an example of a communication module in which an electronic component device according to a preferred embodiment of the present invention is provided.

FIG. 7 is a circuit diagram illustrating an example of a communication module in which an electronic component device according to a preferred embodiment of the present invention is provided.

In a communication module 81, a multiplexer 82 is connected to an antenna ANT. Couplers 83, 87, and 91 are connected to the multiplexer 82. Duplexers 85 and 86 are connected to the coupler 83 via a switch 84. Duplexers 89 and 90 are connected to the coupler 87 via a switch 88. A duplexer 93 and surface acoustic wave filters 94 and 95 are connected to the coupler 91 via a switch 92.

The communication module 81 is preferably an RF module used in, for example, a cellular phone. Electronic component devices according to preferred embodiments of the present invention may be suitably used in such a communication module, including many switches, duplexers, and filters, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component device comprising:
    a resin structure including a first main surface and a second main surface that face each other;
    an electronic component embedded in the resin structure and including a portion exposed on the first main surface of the resin structure;
    a first wiring line extending from the first main surface of the resin structure to the electronic component and electrically connected to the electronic component; and
    a low-elastic modulus layer provided between the first wiring line and the electronic component, having an elastic modulus lower than an elastic modulus of the first wiring line, and made of a conductive material.

2. The electronic component device according to claim 1, wherein the low-elastic modulus layer is provided at a height position between the first wiring line and the exposed portion of the electronic component in a region in which the first wiring line straddles at least a boundary between the resin structure and the electronic component.

3. The electronic component device according to claim 1, further comprising:
    a connection electrode extending through the first main surface and the second main surface of the resin structure and electrically connected to the first wiring line; and
    a second wiring line provided on a side of the second main surface of the resin structure and electrically connected to the connection electrode.

4. The electronic component device according to claim 1, wherein the low-elastic modulus layer is in contact with the first main surface of the resin structure.

5. The electronic component device according to claim 1, wherein, in plan view of the first wiring line, the low-elastic modulus layer overlaps an entire or substantially an entire undersurface of the first wiring line.

6. The electronic component device according to claim 3, further comprising:
    a second low-elastic modulus layer provided between the second wiring line and the resin structure and having electrical conductivity; wherein
    the second low-elastic modulus layer is provided at a height position between the second main surface of the resin structure and the second wiring line in a region in which the second wiring line straddles at least a boundary between the connection electrode and the resin structure.

7. The electronic component device according to claim 1, further comprising an insulating layer surrounding the first wiring line and the second wiring line.

8. The electronic component device according to claim 1, wherein the low-elastic modulus layer is made of a metal or a composite material made of a metal and a resin.

9. The electronic component device according to claim 1, further comprising an electronic component or a substrate joined to the first main surface or the second main surface of the resin structure.

10. The electronic component device according to claim 1, wherein the electronic component device is an interposer including a component.

11. An electronic component device comprising:
    a resin structure including a first main surface and a second main surface that face each other;

an electronic component embedded in the resin structure and including a portion exposed on the first main surface of the resin structure;

a first wiring line extending from the first main surface of the resin structure to the electronic component and electrically connected to the electronic component;

a connection electrode passing through the first main surface and the second main surface of the resin structure and electrically connected to the first wiring line;

a third wiring line connected to the connection electrode and extending from the connection electrode to the first main surface of the resin structure; and a low-elastic modulus layer provided between the third wiring line and the resin structure, having an elastic modulus lower than an elastic modulus of the third wiring line, and made of a conductive material.

12. The electronic component device according to claim 11, wherein the low-elastic modulus layer is provided at a height position between the third wiring line and the exposed portion of the electronic component in a region in which the third wiring line straddles at least a boundary between the connection electrode and the resin structure.

13. The electronic component device according to claim 11, further comprising a second wiring line provided on a side of the second main surface of the resin structure and electrically connected to the connection electrode.

14. The electronic component device according to claim 13, wherein the low-elastic modulus layer is in contact with the first main surface of the resin structure.

15. The electronic component device according to claim 11, wherein, in plan view of the third wiring line, the low-elastic modulus layer overlaps an entire or substantially an entire undersurface of the third wiring line.

16. The electronic component device according to claim 13, further comprising:

a second low-elastic modulus layer provided between the second wiring line and the resin structure and having electrical conductivity; wherein the second low-elastic modulus layer is provided at a height position between the second main surface of the resin structure and the second wiring line in a region in which the second wiring line straddles at least a boundary between the connection electrode and the resin structure.

17. The electronic component device according to claim 11, further comprising an insulating layer surrounding the first wiring line and the second wiring line.

18. The electronic component device according to claim 11, wherein the low-elastic modulus layer is made of a metal or a composite material made of a metal and a resin.

19. The electronic component device according to claim 1, further comprising an electronic component or a substrate joined to the first main surface or the second main surface of the resin structure.

20. The electronic component device according to claim 1, wherein the electronic component device is an interposer including a component.

\* \* \* \* \*